United States Patent

[11] 3,617,824

[72] Inventors Daizaburo Shinoda; Masaoki Ishikawa; Hiroki Muta; Shizuo Asanbe; Nobuo Kawamura, all of Tokyo, Japan

[21] Appl. No. 743,900
[22] Filed July 10, 1968
[45] Patented Nov. 2, 1971
[73] Assignee Nippon Electric Company, Limited Tokyo, Japan
[32] Priority July 12, 1965
[33] Japan
[31] 42/79,658

[54] MOS DEVICE WITH A METAL-SILICIDE GATE
3 Claims, 7 Drawing Figs.

[52] U.S. Cl. 317/235 R, 317/235 B, 317/235 AG, 317/234 L
[51] Int. Cl. H01l 11/14
[50] Field of Search 117/212, 106 A; 317/234 (5.2), 234 (5.4), 235 (21.1), 235 (46), 235 B, 235 AG, 234 L

[56] References Cited
UNITED STATES PATENTS

| | | | |
|---|---|---|---|
| 3,381,182 | 4/1968 | Thorton | 317/234 |
| 3,287,612 | 11/1966 | Lepselter | 317/235 |
| 3,402,081 | 9/1968 | Lehman | 148/188 |
| 3,336,661 | 8/1967 | Polinsky | 29/589 |
| 3,460,003 | 8/1969 | Hampikian | 317/234 |
| 3,434,020 | 3/1969 | Ruggerio | 317/235 |

*Primary Examiner*—John W. Huckert
*Assistant Examiner*—Martin H. Edlow
*Attorney*—Hopgood and Calimafde

ABSTRACT: A semiconductor device obtains in which a silicide film of 3*d*, 4*d* and 5*d* transition metal such as iron (Fe), cobalt (Co), nickel (Ni), molybdenum (Mo), palladium (Pd), platinum (Pt), or the like, is used as a conductive means in place of the conventional simple metal and whose structure is semiconductor-insular-silicide.

INVENTORS
DAIZABURO SHINODA
MASAOKI ISHIKAWA
HIROKI MUTA
SHIZUO ASANABE
NOBUO KAWAMURA

BY Hopgood & Calimafde
ATTORNEYS

MOS DEVICE WITH A METAL-SILICIDE GATE

BACKGROUND OF THE INVENTION

This invention relates to a semiconductor device having a semiconductor substrate, an insulator film formed over one major surface of the substrate, and a conductive layer deposited on the insulator film.

Recently it has been necessary to develop semiconductor techniques for producing highly reliable and effective semiconductor devices, which are miniaturized modified for higher frequency use, and subjected to the large-scale integration. To provide the desired high reliability, a sufficiently heat-resistive and stable ohmic contact, PN junction, Schottky barrier and/or conductive layer should be unfailingly produced. For this purpose, it is important to stabilize the contact between semiconductor element and insulating film; insulator film and conductive film; and conductive film and lead wire. From this point of view, the conductor used for ohmic contact should satisfy the following requirements:

1. Good adherence and low contact resistance to the semiconductor silicon (Si).

2. Good adherence to the insulating film such as silicon dioxide ($SiO_2$) or silicon nitride ($Si_3N_4$).

3. Adaptability to the photomask-etching process.

4. Availability to provide stable bonding to gold (Au) which is used for the lead wire.

Conventionally, aluminum (Al) is the most commonly used metal for the ohmic contact of a semiconductor device. However, there are two rather severe problems associated with the use of aluminum though it satisfies requirements (1) through (a). One of them is caused by the fact that an aluminum layer forms a high-resistance alloy with the gold lead wire, which adversely effects the ohmic contact. Therefore, aluminum is not sufficiently suited for use in a highly reliable ohmic contact.

Recently, a method of forming an ohmic contact has been developed which avoid those problems in the use of aluminum. The process contains the following steps: After heat treatment, a platinum silicide is formed in the boundary layer on the silicon substrate. The nonreacted part of platinum is removed therefrom by chemical treatment and, then titanium (Ti) and platinum are sputtered thereon and gold is deposited thereto by electrolytic plating.

According to this method, it is possible to provide a semiconductor device which has highly stable and reliable ohmic contacts as compared with the method using aluminum. However, this method is inevitably complicated and it is rather difficult to realize a mass-production system.

On the other hand, in order to obtain a semiconductor device having a Schottky barrier, the metallic film should have such property that (1') it is easily and well bonded to silicon and is capable of forming a stable rectifying layer. Also, the metallic film should satisfy the foregoing requirements (2) through (4).

Molybdenum (Mo), palladium (Pd) or the like satisfies the requirement (1') but does not meet (2). In view of the foregoing, there is no material available which can perfectly satisfy the requirements (1) through (4) or (1') through (4) in the case of ohmic contact or Schottky barrier respectively, as long as a simple metal substance is used therein. For this reason, the highly stable ohmic contact or Schottky barrier has hitherto been formed by only resorting to the multilayer technique.

A similar problem arises in the case of the MOS-type semiconductor device which has the metal-insulator-semiconductor layer structure.

Such structure additionally dominates the characteristic and reliability of the device by the electrical stability of the interior state between the semiconductor substrate and insulator formed on the substrate.

Similarly, in the field of the large-scale integration (LSI), the multilevel technique has been adopted to provide the interconnection among the elements in the substrate. In the multilevel interconnection structure, the conductive and insulative layers formed in contact with each other over the substrate should have excellent adhesive property, heat- and shock- resisting property, adaptability to photomask-etching process, and stability against various electrical conditions to which the substrate is subjected in processing. According to the common process of manufacturing the LSI device, the alkaline (mostly sodium) ions, which enter into the insulative film (silicon dioxide layer) in the process of evaporation or sputtering metal layer to form the conductive layer over the insulative film, adversely affect the electrical stability of boundary layers between the silicon substrate and the oxide film. The deterioration in the boundary layer adversely affects the reliability of the LSI device the same as the MOS-type device.

Also, in the conventional structure of the LSI device, neither aluminum nor molybdenum is satisfactory to form the metal layer, because the former easily deteriorate in the process of forming thereover the oxide insulative layer and the latter is insufficient in its adhesive and contacting property. For these reasons, it has been difficult to provide the LSI devices of high reliability, which satisfy the above-mentioned requirements.

An object of the present invention is therefore, to provide a highly stable and highly reliable semiconductor device satisfying all of the requirements mentioned above.

SUMMARY OF THE INVENTION

According to this invention, a semiconductor device obtains in which a silicide film of *3d*, *4d* and *5d* transition metal such as iron (Fe), cobalt (Co), nickel (Ni), molybdenum (Mo), palladium (Pd), platinum (Pt), or the like, is used as a conductive means in place of the conventional simple metal and whose structure is semiconductor-insulator-silicide. In the present invention, it is found that the silicide of transition metal forms an excellent ohmic or Schottky barrier contact between itself and silicon and has good adherence to silicon, silicon dioxide, silicon nitride and so on. Also the silicide has the low resistivity and adaptability to photomask etching, and it does not cause a deterioration in the electrical characteristic of the insulator film in the forming process of silicide onto the insulator.

Therefore the semiconductor device is thus characterized in that the silicide forms good contact to semiconductor, the silicide-insulator-semiconductor characteristics is extremely stable and the manufacturing process is simple. This the present invention is applicable to planar-type semiconductors, field effect semiconductors of the insulated gate type, and large-scale integrated circuits having a multilevel interconnection structure.

The present invention will be explained in particular conjunction with the accompanying drawings.

Figure 6:
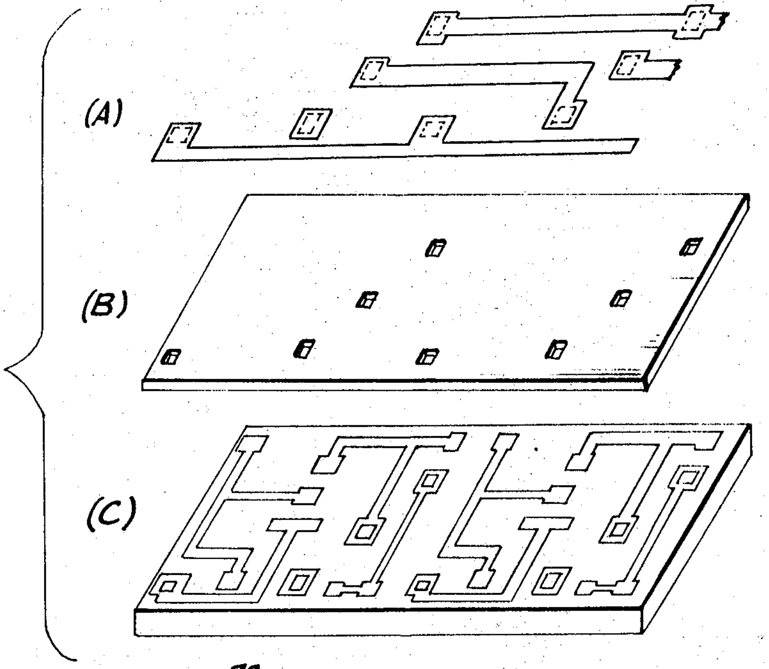
Figure 7:
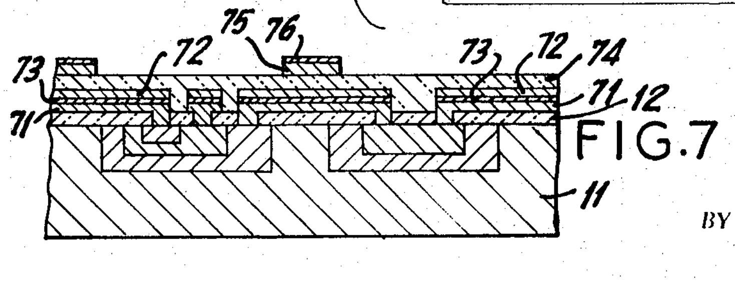

FIGS. 6(A) through 6(C) show the multilevel structure of an integrated circuit to which the present invention is applied; and FIG. 7 is a partial cross-sectional view illustrating the fourth embodiment of this invention.

Figure 1:
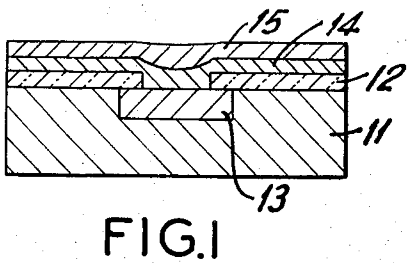
FIG. 1 is a longitudinal cross-sectional view illustrating the first embodiment of this invention.

In the simple PP junction diode shown in FIG. 1, which is a first embodiment this invention, as insulating film 12 is formed over an n-type single crystal silicon substrate 11, by thermally growing silicon dioxide. Through a small circular hole prearranged at said insulating film 12, a P-type impurity is diffused so that the diffused region 13 of P-type conduction is formed in the substrate 11. To establish a favorable ohmic contact onto the P-type diffusion region 13, a cobalt silicide 14 is deposited on the entire surface including the insulating film 12 of silicon dioxide by vacuum evaporation of cathode-sputtering to about 2,000 Angstrom thickness. Then, a stable conductive metal film 15, such as a gold or platinum film, is deposited thereon, to about 5,000 Angstrom thickness. After this deposition of metal film, said metal film 15 and transition metal silicide film 14 are etched into a specific shape by the photomask-etching process. In the foregoing manner, the invention provides a highly stable and highly reliable semiconductor device through a simple process. In this embodiment, the specific resistance of the ohmic contact formed between cobalt silicide 14 and p-type region 13 whose specific resistivity is $2\times10^{13}$ ohm-cm is less than about $4\times10^{16}$ ohm-cm $^2$. This specific contact resistance is very small compared with the specific contact resistance, (i.e., $3.7\times10^{15}$ ohm-cm.$^2$ of the conventional device. Even when the P-type region 13 is replaced by an n-type silicon of specific resistivity $1\times10^3$ ohm-cm. and platinum silicide (PtSi) is used as the transition metal silicide 14, a favorable ohmic contact of the specific contact resistance $6\times10^{16}$ ohm-cm.$^2$ is obtained. It is to be noted that the ohmic contact obtained according to this invention is stable from the thermal as well as the mechanical point of view.

Figure 2:
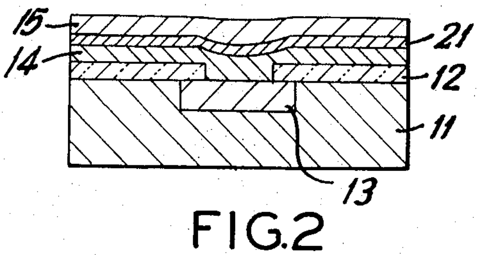
FIG. 2 is a longitudinal cross-sectional view illustrating a modification of the first embodiment shown in Fig. 1.

The same effect as stated above can be obtained from this embodiment even if modified to a certain extent. More particularly, referring to FIG. 2, the heat treatment may be accomplished after depositing the transition metal silicide 14. Alternatively a stable conduction metal film 15, such as a platinum or gold film may be added thereto via a metallic film 21 of titanium or chromium (Cr), after depositing a transition metal silicide 14. In FIG. 2 the same reference numerals are used to designate the same elements as in Fig. 1, Still another example related to the Schottky barrier diode will be explained below.

Referring again to Figure 1, the semiconductor substrate 11 and region 13 are of N-type silicon whose specific resistivities are respectively $2\times10^{13}$ ohm-cm. and 0.8 ohm-cm. A silicon dioxide film 12 is thermally grown on the surface of each of the regions 11 and 13. A circular hole is provided in the oxide file 12, to expose the surface of silicon. The exposed surface is cleaned by chemical treatment. After this process, a transition metal silicide 14, such as cobalt silicide, is evaporated thereon to about 2,000 thickness under a super high vacuum condition. Further, an electrode 15 is deposited onto the silicide 14. The resultant metal layers are then formed into a specific shape through a photoetching process. The characteristic of the Schottky barrier diode are tabulated below, in comparison with those of a conventional diode having molybdenum (Mo).

| Metal which forms Schottky barrier (specific resistance of N-type silicon: 0.8 ohm-cm.) (contact area: $1.9\times10^{15}$ cm.$^2$) | Height of barrier ev. | Current value when forword voltage is 1 volt (ampere) | Current value when inverse voltage is 4 volts (ampere) | Peak withstand voltage (volt) |
|---|---|---|---|---|
| CoSi | 0.65 | $80\times10^{13}$ | $16\times10^{10}$ | 18 |
| FeSi | 0.58 | $88\times10^{13}$ | $30\times10^{10}$ | 18 |
| PdSi | 0.73 | $78\times10^{13}$ | $15\times10^{19}$ | 20 |
| PtSi | 0.82 | $70\times10^{13}$ | $10\times10^{10}$ | 25 |
| Mo | 0.65 | $68\times10^{13}$ | $40\times10^{19}$ | 15 |

As is evidently shown in the table, the Schottky diode of this invention is highly efficient and its production process can be simplified and, further, the heat-resisting property is markedly improved owing to the use of said silicide.

Figure 3:
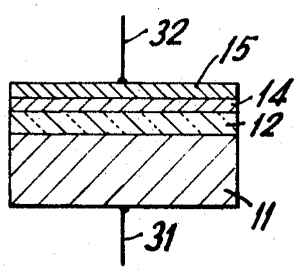
FIG. 3 is a longitudinal cross-sectional view illustrating the second embodiment of this invention.

Fig. 3 is a sectional view showing a second embodiment of this invention, whose structure is a MOS diode obtained in accordance with the present invention.

Referring to Fig. 3, a silicon dioxide film 12 is formed on the surface of an N-type silicon substrate 11 having a specific resistance of 10 ohm-cm after oxidation in dry oxygen at 1,150° C. for 2 hours. The oxide film on the lower side of the substrate 11 is removed by chemical process, and on the upper side of the silicon oxide film 12 there is deposited a metal silicide 14, e.g., cobalt silicide, by evaporation at a high vacuum to a thickness of about 2,000 A., and then a suitable metal 15 is vaporized thereon. After the deposition of the metal film 15, the metal film 15 and cobalt silicide film 14 are shaped into a predetermined configurations by photomask etching. The silicon substrate 11 is cut to a suitable size, and lead wires 31, 32 are connected, respectively, to the lower side of the silicon piece and to the metal film 15.

Figure 4:
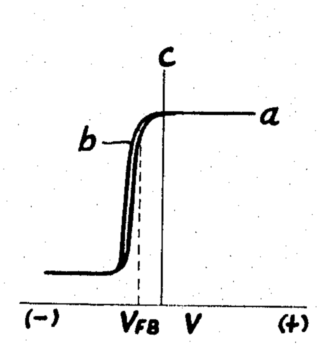
FIG. 4 is a graph showing capacitance vs. applied voltage characteristic of the device of Fig. 3.

The capacity-voltage characteristics of the diode structure of the cobalt silicide-silicon dioxide-silicon thus formed are shown in Fig. 4. The capacity-voltage characteristic of the diode just formed is represented by the curve *a* in the figure, while the capacity-voltage characteristic of the diode after the heat treatment in air at 250° C. for 30 minutes with the application of an electric field of 3×10'6 V/cm. with the metal maintained positive and the silicon negative is represented by the curve *b*.

When calculated from the curve *a* of FIG. 4, the surface charged carrier density of the resulting diode is about $5\times10^{11}$/cm.$^2$ and, as can be seen from the curve *b* of FIG. 2, the surface-charged carrier density remains substantially unchanged even with a heat treatment with the voltage applied. It will be thus apparent that a diode having surface states between silicon and silicon dioxide can be obtained.

Figure 5:
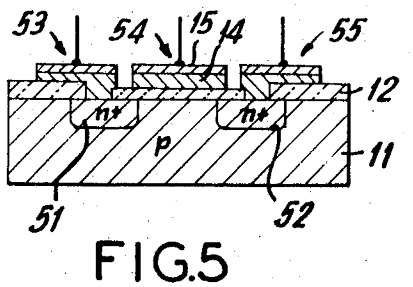
FIG. 5 is a longitudinal cross-sectional view of the third embodiment of this invention.

Fig. 5 shows a field effect transistor of MOS type, a form of semiconductor device obtained in accordance with the present invention. Within a P-type silicon substrate 11 there is formed an $N^+$-type region source 51 and drain 52. Holes are then made at predetermined points of the silicon dioxide film 12. Next, cobalt silicide 14 and a simple metal 15 are deposited by evaporation on the surface, and a source electrode 53, gate electrode 54, and drain electrode 55 are etched to the desired shapes by photomask etching. In such field effect transistors of the MOS type, the stability of surface states of the silicon substrate the gate electrode has a direct bearing upon the reliabliity of the operating characteristics. The transistor of this embodiment has such stable surface states that the transistor functions most satisfactorily without variation of the operating characteristics.

With the embodiments of FIGS. 3 and 5, it is feasible for the gate electrode to be formed of silicide, to maintain the surface stability of the gate insulator.

Referring to FIGS. 6(A) through (C) and Fig. 7, the fourth embodiment of this invention has a multilevel interconnection structure.

Fig. 6A shows an integrated circuit substrate in which circuit components such as transistors, diodes, and resistors is formed and interconnected with a composite conductive film such as silicide-metal-silicide. On the surface of the semiconductor, an insulating film of silicon dioxide and/or another insulator is deposited by a chemical reaction or sputtering. Apertures are formed in the insulator layer in the desired pattern for photomask etching use, as shown in FIG. 6B. Next, a metal silicide and a low-resistance metal are deposited on the insulator and through apertures provide multilevel interconnection among the circuits as shown in FIG. 6C.

A partial sectional view of the resulting integrated circuit 70 is shown in FIG. 7. Referring to FIG. 7, a silicon substrate 11 is coated by silicon dioxide 12. In the substrate 11, transistors, diodes and resistors are formed. Interconnection among the elements is achieved by films of a metal silicide 71, 72 and a low-resistance metal 73 which altogether form a triple layer. The entire surface of the integrated circuit substrate, except for the through-holes, is covered by an insulating film 74. Through the apertures, the upper level interconnections formed by a metal silicide 75 and a low-resistance metal 76 are connected to the underlying circuits.

According to this embodiment, integrated circuits of high degree of integration are obtained, and the multilevel interconnection attained in accordance with the invention is highly reliable because it is extremely stabilized thermally and electrically.

The metal silicide to be used in the invention is not limited to what has been shown in the described embodiments but any metal silicide may be used so long as such a silicide is chemically stable, low in specific resistance, and satisfactory as regards its bonding property toward silicon and insulating film. Various experiments have been conducted and it was found that the following transition metals silicide are especially favorable for the purpose of this invention:

3*d* Transition Metal Silicide titanium silicides ($Ti_5Si_3$, $TiSi_2$) vanadium silicides ($V_5Si_3$, $VSi_2$), chromium silicides ($Cr_3Si$, CrSi, $CrSi_2$), manganese silicides ($Mn_5Si_3$, MnSi, $Mn_4Si_7$), iron silicides (FeSi, $FeSi_2$) cobalt silicides ($Co_2Si$, CoSi, $CoSi_2$), nickel silicides ($NiSi_2$, $Ni_2Si$, NiSi).

4*d* or 5*d* Transition Metal Silicide palladium silicides ($Pd_2Si$, PdSi), platinum silicides ($Pt_2Si$, PtSi).

While the invention has been explained in connection with specific embodiments, it is to be understood that this explanation is made only by way of example and not as a limitation to the scope of the invention.

Claims for Patent

1. In a field effect semiconductor device of MOS type having a semiconductor substrate, the improvement comprising a layer of metal silicide means deposited on an insulative layer lying on the surface of the semiconductor substrate, said means forming a stable capacitance-voltage said metal silicide being selected characteristic from the group consisting of platinum silicide, cobalt silicide and palladium silicide.

2. The improvement as claimed in claim 1, wherein said metal silicide is cobalt silicide and wherein a layer of metal of low electrical resistance covers the metal silicide layer.

3. The improvement as claimed in claim 1, wherein two impurity-diffused regions having the opposite conductivity type to said substrate are formed in said substrate in such a relation that the portion of the surface of said semiconductor substrate lying under said metal silicide layer may be interposed between said two regions, and electrical leadout members are applied to each of said regions said metal silicide layer.

* * * * *

UNITED STATES PATENT OFFICE

CERTIFICATE OF CORRECTION

Patent No. 3,617,824 Dated November 2, 1971

Inventor(s) Daizaburo Shinoda, et al

It is certified that error appears in the above-identified patent and that said Letters Patent are hereby corrected as shown below:

Column 6, line 8, after "voltage" should read -- characteristic --; line 9, after "selected" cancel "characteristic"; line 12, after "layer of" should read --a --; line 21, after "regions" should read -- and --.

Signed and sealed this 10th day of October 1972.

(SEAL)
Attest:

EDWARD M.FLETCHER,JR.
Attesting Officer

ROBERT GOTTSCHALK
Commissioner of Patents